United States Patent
Takano et al.

(10) Patent No.: US 9,587,316 B2
(45) Date of Patent: Mar. 7, 2017

(54) THERMOPLASTIC RESIN COMPOSITION, RESIN MOLDED ARTICLE, AND METHOD FOR MANUFACTURING RESIN MOLDED ARTICLE HAVING A PLATED LAYER

(71) Applicant: MITSUBISHI ENGINEERING-PLASTICS CORPORATION, Tokyo (JP)

(72) Inventors: Takahiro Takano, Kanagawa (JP); Takahiko Sumino, Kanagawa (JP); Kentarou Ishihara, Tokyo (JP); Naohisa Akashi, Tokyo (JP)

(73) Assignee: Mitsubishi Engineering-Plastics Corporation, Tokyo (JP)

( * ) Notice: Subject to any disclaimer, the term of this patent is extended or adjusted under 35 U.S.C. 154(b) by 22 days.

(21) Appl. No.: 14/427,849

(22) PCT Filed: Sep. 5, 2013

(86) PCT No.: PCT/JP2013/073953
§ 371 (c)(1),
(2) Date: Mar. 12, 2015

(87) PCT Pub. No.: WO2014/042071
PCT Pub. Date: Mar. 20, 2014

(65) Prior Publication Data
US 2015/0247243 A1    Sep. 3, 2015

(30) Foreign Application Priority Data
Sep. 14, 2012    (JP) .................................. 2012-203372

(51) Int. Cl.
C08K 3/40    (2006.01)
C23C 18/28   (2006.01)
(Continued)

(52) U.S. Cl.
CPC .......... *C23C 18/285* (2013.01); *C08G 69/265* (2013.01); *C08K 3/22* (2013.01);
(Continued)

(58) Field of Classification Search
None
See application file for complete search history.

(56) References Cited

U.S. PATENT DOCUMENTS 5,928,780 A    7/1999    Schmidt et al.
6,214,917 B1   4/2001    Linzmeier et al.
(Continued)

FOREIGN PATENT DOCUMENTS

CN    102066122 A    5/2011
CN    102066473 A    5/2011
(Continued)

OTHER PUBLICATIONS

Chinese Office Action and Search Report, dated Dec. 16, 2015, for Chinese Application No. 201380043320.9, with an English translation of the Office Action.
(Continued)

*Primary Examiner* — Melvin C Mayes
*Assistant Examiner* — Colette Nguyen
(74) *Attorney, Agent, or Firm* — Birch, Stewart, Kolasch & Birch, LLP

(57) ABSTRACT

Provide is a thermoplastic resin composition from which a resin molded article having high whiteness and mechanical strength can be obtained while retaining the plating properties of the resin molded article. A thermoplastic resin composition comprising a thermoplastic resin, and 1 to 30 parts by weight of a laser direct structuring additive, 0.1 to 20 parts by weight of a titanium oxide and 10 to 230 parts by weight of a glass fiber per 100 parts by weight of the thermoplastic resin, wherein the laser direct structuring
(Continued)

additive has an L value of 50 or more, and the glass fiber comprises $SiO_2$ and $Al_2O_3$ in a proportion of 60 to 70% by weight of $SiO_2$ and 20 to 30% by weight of $Al_2O_3$.

20 Claims, 1 Drawing Sheet

(51) Int. Cl.

| | |
|---|---|
| C08K 3/22 | (2006.01) |
| C08K 7/14 | (2006.01) |
| H01Q 1/38 | (2006.01) |
| H01Q 1/24 | (2006.01) |
| C08G 69/26 | (2006.01) |
| C08L 77/06 | (2006.01) |
| C23C 18/16 | (2006.01) |
| C23C 18/20 | (2006.01) |
| C23C 18/38 | (2006.01) |
| H05K 3/18 | (2006.01) |
| H05K 1/03 | (2006.01) |

(52) U.S. Cl.
CPC ............. *C08K 3/2279* (2013.01); *C08K 7/14* (2013.01); *C08L 77/06* (2013.01); *C23C 18/1608* (2013.01); *C23C 18/1612* (2013.01); *C23C 18/1641* (2013.01); *C23C 18/204* (2013.01); *C23C 18/38* (2013.01); *H01Q 1/243* (2013.01); *H01Q 1/38* (2013.01); *H05K 3/182* (2013.01); *C08K 2003/2231* (2013.01); *C08K 2003/2241* (2013.01); *H05K 1/0366* (2013.01); *H05K 1/0373* (2013.01); *H05K 2201/0236* (2013.01); *H05K 2203/107* (2013.01)

(56) References Cited

U.S. PATENT DOCUMENTS

| | | | |
|---|---|---|---|
| 6,696,173 B1 | 2/2004 | Naundorf et al. | |
| 8,309,640 B2 | 11/2012 | Li et al. | |
| 8,492,464 B2 | 7/2013 | Li et al. | |
| 8,933,161 B2* | 1/2015 | Takano | C08J 5/043 |
| | | | 524/494 |
| 9,115,269 B2* | 8/2015 | Fujimori | |
| 2006/0083939 A1 | 4/2006 | Dunbar et al. | |
| 2009/0292051 A1 | 11/2009 | Li et al. | |
| 2011/0281135 A1 | 11/2011 | Gong et al. | |
| 2013/0143994 A1 | 6/2013 | van Hartingsveldt et al. | |
| 2014/0002311 A1* | 1/2014 | Takano | C08J 5/043 |
| | | | 343/700 MS |
| 2014/0147682 A1 | 5/2014 | Takano et al. | |

FOREIGN PATENT DOCUMENTS

| | | | |
|---|---|---|---|
| JP | 8-81639 A | | 3/1996 |
| JP | 9-12776 A | | 1/1997 |
| JP | 10-500149 A | | 1/1998 |
| JP | 2000-503817 A | | 3/2000 |
| JP | 2004-534408 A | | 11/2004 |
| JP | 2006-124701 A | | 5/2006 |
| JP | 2007-55110 A | | 3/2007 |
| JP | 2008-201050 A | | 9/2008 |
| JP | 2010-274530 A | | 12/2010 |
| JP | 2010-536947 A | | 12/2010 |
| JP | 2011-273041 | * | 12/2011 |
| JP | WO 20120081391 | * | 6/2012 |
| JP | 5340513 B1 | | 11/2013 |
| WO | WO 2005/000969 A1 | | 1/2005 |
| WO | WO 2009/141800 A2 | | 11/2009 |
| WO | WO 2012/056385 A1 | | 5/2012 |
| WO | WO 2012/128219 A1 | | 9/2012 |

OTHER PUBLICATIONS

International Preliminary Report on Patentability and Written Opinion of the International Searching Authority (forms PCT/IB/338, PCT/IB/326, PCT/IB/373, PCT/ISA/237), issued Mar. 26, 2015, for International Application No. PCT/JP2013/073953, with an English translation of the Written Opinion.
International Search Report and Written Opinion of the International Searching Authority (forms PCT/ISA/220, PCT/ISA/210, PCT/ISA/237), issued Dec. 3, 2013, for International Application No. PCT/JP2013/073953.
Extended European Search Report for Application No. 13836606.7 dated Apr. 25, 2016.

* cited by examiner

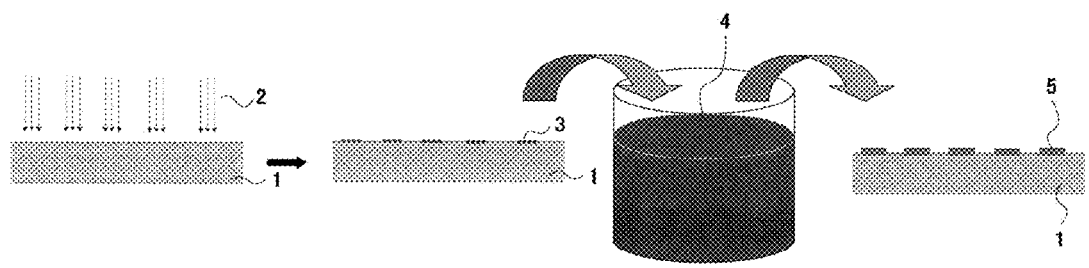

THERMOPLASTIC RESIN COMPOSITION, RESIN MOLDED ARTICLE, AND METHOD FOR MANUFACTURING RESIN MOLDED ARTICLE HAVING A PLATED LAYER

TECHNICAL FIELD

The present invention relates to a thermoplastic resin composition. It also relates to resin a molded article obtained by molding the thermoplastic resin composition, and a method for manufacturing a resin molded article having a plated layer formed on a surface of the resin molded article.

BACKGROUND ART

With recent development of cell phones including smartphones, various processes for manufacturing antennas inside the cell phones have been proposed. Especially, it would be desirable to provide a method for manufacturing an antenna that can be three-dimensionally designed in a cell phone. The laser direct structuring (hereinafter sometimes referred to as "LDS") technology has drawn attention as one of technologies for forming such three-dimensional antennas. The LDS technology refers to a technology for forming a plated layer by, for example, irradiating the surface of a resin molded article containing an LDS additive with a laser beam to activate only the region irradiated with the laser beam and applying a metal on the activated region. This technology is characterized in that metal structures such as antennas can be directly manufactured on the surface of resin substrates without using any adhesive or the like. The LDS technology is disclosed in, for example, patent documents 1 to 3 and the like.

REFERENCES

Patent Documents

Patent document 1: JP-A2000-503817
Patent document 2: JP-A2004-534408
Patent document 3: International Publication WO2009/141800.

SUMMARY OF THE INVENTION

Problems to be Solved by the Invention

On the other hand, it would be desirable to provide a white resin composition when it is used to form a resin molded article because such a resin molded article will be colored. However, some white resin compositions may be transparent to laser beams with which they are irradiated so that the irradiated region cannot be appropriately activated. If the irradiated region could not be appropriately activated, any plated layer could not be appropriately formed on the resin molded article.

Further, it would also be desirable to improve the mechanical strength of resin molded articles obtained by molding thermoplastic resin compositions.

The present invention aims to solve the problems of the prior art described above, thereby providing thermoplastic resin a composition from which a resin molded article having high whiteness and mechanical strength can be obtained while retaining the plating properties of the resin molded article.

Means to Solve the Problems

As a result of our careful studies under these circumstances, we achieved the present invention on the basis of the finding that the problems described above can be solved by combining a thermoplastic resin with an LDS additive having an L value of 50 or more, a titanium oxide, and a glass fiber comprising $SiO_2$ and $Al_2O_3$ in a proportion of 60 to 70% by weight of $SiO_2$ and 20 to 30% by weight of $Al_2O_3$. Specifically, the problems described above were solved by the following means <1>, preferably <2> to <14>.

<1> A thermoplastic resin composition comprising a thermoplastic resin, and 1 to 30 parts by weight of a laser direct structuring additive, 0.1 to 20 parts by weight of a titanium oxide and 10 to 230 parts by weight of a glass fiber per 100 parts by weight of the thermoplastic resin, wherein the laser direct structuring additive has an L value of 50 or more, and the glass fiber comprises $SiO_2$ and $Al_2O_3$ in a proportion of 60 to 70% by weight of $SiO_2$ and 20 to 30% by weight of $Al_2O_3$.

<2> The thermoplastic resin composition according to <1>, wherein the laser direct structuring additive is an oxide containing antimony and tin.

<3> The thermoplastic resin composition according to <2>, wherein the laser direct structuring additive contains tin in excess of antimony.

<4> The thermoplastic resin composition according to any one of <1> to <3>, wherein the glass fiber has a tensile modulus of elasticity of 80 GPa or more.

<5> The thermoplastic resin composition according to any one of <1> to <4>, wherein the glass fiber comprises S-glass.

<6> The thermoplastic resin composition according to any one of <1> to <5>, wherein the thermoplastic resin is a polyamide resin.

<7> A resin molded article obtained by molding the thermoplastic resin composition according to any one of <1> to <6>.

<8> The resin molded article according to <7>, which has an L value of 60 or more.

<9> The resin molded article according to <8>, further comprising a plated layer on a surface thereof.

<10> The resin molded article according to <8> or <9>, which is a part for portable electronic devices.

<11> The resin molded article according to <9> or <10>, wherein the plated layer has performance as an antenna.

<12> A method for manufacturing a resin molded article having a plated layer, comprising irradiating a surface of a resin molded article obtained by molding the thermoplastic resin composition according to any one of <1> to <6> with a laser beam, and then applying a metal to form a plated layer.

<13> The method for manufacturing a resin molded article having a plated layer according to <12>, wherein the plated layer is a copper plated layer.

<14> A method for manufacturing a part for portable electronic devices, comprising a method for manufacturing a resin molded article having a plated layer according to <12> or <13>.

Advantages of the Invention

The present invention makes it possible to provide thermoplastic resin molded articles having high whiteness and mechanical strength while retaining the plating properties of the resin molded articles.

BRIEF EXPLANATION OF THE DRAWINGS

FIG. 1 is a schematic diagram showing a process for plating the surface of a resin molded article.

THE MOST PREFERRED EMBODIMENTS OF THE INVENTION

The present invention will be explained in detail below. As used herein, each numerical range expressed by two values on both sides of "to" is used to mean the range including the values indicated before and after "to" as lower and upper limits.

<Thermoplastic Resin Composition>

The thermoplastic resin composition of the present invention comprises a thermoplastic resin, and 1 to 30 parts by weight of an LDS additive, 0.1 to 20 parts by weight of a titanium oxide and 10 to 230 parts by weight of a glass fiber per 100 parts by weight of the thermoplastic resin, characterized in that the LDS additive has an L value (lightness) of 50 or more, and the glass fiber comprises $SiO_2$ and $Al_2O_3$ in a proportion of 60 to 70% by weight of $SiO_2$ and 20 to 30% by weight of $Al_2O_3$.

Further, the thermoplastic resin composition of the present invention preferably have an L value of 60 or more. When the thermoplastic resin composition have an L value of 60 or more, whiteness is more improved so that resin molded articles obtained by molding the thermoplastic resin composition can have improved whiteness. Thus, such resin molded articles can be colored. The L value of the thermoplastic resin composition can be measured by using, for example, a colorimeter.

<Thermoplastic Resin>

The thermoplastic resin composition of the present invention comprises a thermoplastic resin. The type of the thermoplastic resin is not specifically limited, and examples include polycarbonate resins, alloys of polyphenylene ether resins and polystyrene resins, alloys of polyphenylene ether resins and polyamide resins, thermoplastic polyester resins, methyl methacrylate/acrylonitrile/butadiene/styrene copolymer resins, methyl methacrylate/styrene copolymer resins, methyl methacrylate resins, rubber-reinforced methyl methacrylate resins, polyamide resins, polyacetal resins, polylactic resins, polyolefin resins and the like.

In the present invention, polyamide resins and thermoplastic polyester resins are preferably used, more preferably polyamide resins. The thermoplastic resins may be used alone or as a combination of two or more of them.

Polyamide resins are polyamide polymers that contain an acid amide group (—CONH—) in the molecule and that can be melted by heating. Specifically, the polyamide resin includes various polyamide resins such as polycondensates of lactams, polycondensates of diamine compounds with dicarboxylic acid compounds, polycondensates of co-aminocarboxylic acids and the like, or copolyamide resins or blends thereof and the like.

Lactams that can be polycondensed into polyamide resins include, for example, ε-caprolactam, ω-laurolactam and the like.

Diamine compounds include, for example, aliphatic, alicyclic and aromatic diamines such as tetramethylenediamine, hexamethylenediamine, undecamethylenediamine, dodecamethylenediamine, 2-methylpentamethylenediamine, 2,2,4- or 2,4,4-trimethylhexamethylenediamine, 5-methylnonamethylenediamine, m-xylylenediamine (MXDA), p-xylylenediamine, 1,3-bis(aminomethyl)cyclohexane, 1,4-bis(aminomethyl)cyclohexane, 1-amino-3-aminomethyl-3,5,5-trimethylcyclohexane, bis(4-aminocyclohexyl)methane, bis(3-methyl-4-aminocyclohexyl)methane, 2,2-bis(4-aminocyclohexyl)propane, bis(aminopropyl)piperazine, aminoethylpiperazine and the like.

Dicarboxylic acid compounds include, for example, aliphatic, alicyclic and aromatic dicarboxylic acids such as adipic acid, suberic acid, azelaic acid, sebacic acid, dodecanedioic acid, terephthalic acid, isophthalic acid, 2-chloroterephthalic acid, 2-methylterephthalic acid, 5-methylisophthalic acid, 5-sulfoisophthalic acid sodium salt, hexahydroterephthalic acid, hexahydroisophthalic acid and the like.

ω-Aminocarboxylic acids include, for example, amino acids such as 6-aminocaproic acid, 11-aminoundecanoic acid, 12-aminododecanoic acid, p-aminomethylbenzoic acid and the like.

Specific examples of polyamide resins obtained by polycondensing these materials include polyamide 4, polyamide 6, polyamide 11, polyamide 12, polyamide 46, polyamide 66, polyamide 610, polyamide 612, polyhexamethylene terephthalamide (polyamide 6T), polyhexamethylene isophthalamide (polyamide 6I), poly(m-xylylene adipamide) (polyamide MXD6), poly(m-xylylene dodecamide), polyamide 9T, polyamide 9MT and the like. In the present invention, these polyamide homopolymers or copolymers can be used alone or as a mixture thereof.

Among the polyamide resins described above, polyamide 6, polyamide 66, or xylylenediamine polyamide resins (MX nylons) obtained by polycondensation of straight-chain aliphatic α,ω-dibasic acids with xylylenediamines are more preferably used to improve moldability and heat resistance. Among them, MX nylons are more preferred to improve heat resistance and flame retardance. When the polyamide resins are used as a mixture, the proportion of MX nylons in the polyamide resins is preferably 50% by weight or more, more preferably 80% by weight or more.

MX nylons are preferably used in combination with aliphatic polyamide resins such as polyamide 66, polyamide 6, polyamide 46, polyamide 9T and the like to shorten the molding cycle because MX nylons crystallize somewhat more slowly than aliphatic polyamide resins. Aliphatic polyamide resins used to shorten the molding cycle include rapidly crystallizing polyamide resins such as polyamide 66, polyamide 6, polyamide 46, polyamide 9T and the like and polyamide resins having a high melting point such as polyamides 66/6T, 66/6T/6I and the like, among which polyamide 66 or polyamide 6 is preferred from an economic viewpoint. From the viewpoint of the balance between moldability and physical properties, the contents of the aliphatic polyamide resins is preferably less than 50% by weight of the total polyamide resin, more preferably 1 to 20% by weight, to improve moldability and the balance between physical properties. More good heat resistance can be maintained by adding less than 50% by weight of the aliphatic polyamide resins.

Straight-chain aliphatic α,ω-dibasic acids that can be preferably used as one raw material of MX nylons are straight-chain aliphatic α,ω-dibasic acids containing 6 to 20 carbon atoms such as adipic acid, sebacic acid, suberic acid, dodecanedioic acid, eicosadienoic acid and the like. Among these straight-chain aliphatic α,ω-dibasic acids, adipic acid is especially preferred in terms of moldability, the balance among performances of molded articles and the like.

Xylylenediamines used as the other raw material of MX nylons include m-xylylenediamine or xylylenediamine mixtures of p-xylylenediamine and m-xylylenediamine. The molar ratio of m-xylylenediamine and p-xylylenediamine (m-xylylenediamine/p-xylylenediamine) in the xylylenediamine mixtures is preferably 55/45 to 100/0, more preferably 70/30 to 100/0. The molar proportion of p-xylylenediamine is preferably less than 45 mol % because the melting point of the polyamide resins can be kept low, which makes it easy to polymerize the MX nylons or to mold compositions containing the MX nylons.

Description about thermoplastic polyester resins can be found in paragraphs 0013 to 0016 of JP-A2010-174223, the contents of which are incorporated herein. For example, polyester resins include a polybutylene terephthalate resin, or a mixture containing 60% by weight or more, preferably 80% by weight or more of a polybutylene terephthalate resin.

The amount of the thermoplastic resin contained in the thermoplastic resin composition of the present invention is preferably 30% by weight or more, more preferably 35% by weight or more, further preferably contains in the rang of 35 to 70% by weight in total.

<LDS Additive>

As used herein, the term "LDS additive" refers to a compound that allows a thermoplastic resin (for example, the polyamide resin synthesized in the Examples described later) to be plated with a metal when 10 parts by weight of the compound as a possible LDS additive is added per 100 parts by weight of the resin and the resin is irradiated with a YAG laser beam having a wavelength of 1064 nm at an output power of 13 W, a frequency of 20 kHz, and a scanning speed of 2 m/s, and then subjected to a plating process to apply the metal on the surface irradiated with the laser beam in the electroless plating bath MID Copper 100 XB Strike from MacDermid. The LDS additive used in the present invention may be synthesized or commercially available. In addition to commercially available products sold for use as LDS additives, those sold for other purposes may also be used so far as they meet the requirements for the LDS additive in the present invention. A single LDS additive may be used or two or more LDS additives may be used in combination.

The LDS additive used in the present invention typically has an L value of 50 or more, preferably 55 or more, more preferably 60 or more. When an LDS additive having an L value of 50 or more is added to the thermoplastic resin, the resulting thermoplastic resin composition can have a higher L value. In other words, the resulting thermoplastic resin composition has a brighter color with an increased L value, whereby the thermoplastic resin composition can be whiter. The upper limit of the L value is not specifically defined, but can be, for example, 100 or less. The L value of the LDS additive can be measured by using, for example, a colorimeter in the same manner as for the L value of the thermoplastic resin composition described above.

The LDS additive used in the present invention is not specifically limited so far as the LDS additive satisfies the L value defined above, but examples that can be used include, for example, an oxide containing antimony and tin, an oxide containing phosphorus and tin, or an oxide containing antimony, phosphorus and tin, preferably an oxide containing antimony and tin. When an oxide containing antimony and tin is used as the LDS additive in this manner, plating properties can be more improved. Another example includes a conductive oxide containing at least two metals and having a resistivity of $5 \times 10^3$ $\Omega \cdot cm$ or less as described below.

When the LDS additive used in the present invention is an oxide containing antimony and tin, the LDS additive more preferably contains tin in excess of antimony, even more preferably contains 80% by weight or more of tin based on the total amount of tin and antimony, for example. Such LDS additives include, for example, a tin oxide doped with antimony, and a tin oxide doped with an antimony oxide. For example, the amount of antimony contained in the oxide containing antimony and tin is preferably 1 to 20% by weight.

Preferred embodiments of the LDS additive used in the present invention are described below. However, it should be understood that the LDS additive used in the present invention is not limited to these embodiments.

A first embodiment of the LDS additive used in the present invention is an embodiment wherein metal components contained in the LDS additive comprise 90% by weight or more of tin, 5% by weight or more of antimony, and lead and/or copper as minor components. In the first embodiment, the LDS additive more preferably comprises 90% by weight or more of tin, 5 to 9% by weight of antimony, 0.01 to 0.1% by weight of lead, and 0.001 to 0.01% by weight of copper.

More specifically, the LDS additive used in the present invention preferably comprises 90% by weight or more of a tin oxide, and 3 to 8% by weight of an antimony oxide, and preferably further comprises 0.01 to 0.1% by weight of a lead oxide and/or 0.001 to 0.01% by weight of a copper oxide. An especially preferred embodiment is an embodiment that uses an LDS additive comprising 90% by weight or more of a tin oxide, 3 to 8% by weight of an antimony oxide, 0.01 to 0.1% by weight of a lead oxide, and 0.001 to 0.01% by weight of a copper oxide. A more preferred embodiment is an embodiment that uses an LDS additive comprising 93% by weight or more of a tin oxide, 4 to 7% by weight of an antimony oxide, 0.01 to 0.05% by weight of a lead oxide and 0.001 to 0.006% by weight of a copper oxide.

In addition to lead and/or copper, the LDS additive used in the present invention may contain minor amounts of other metals. Examples of the other metals include indium, iron, cobalt, nickel, zinc, cadmium, silver, bismuth, arsenic, manganese, chromium, magnesium, calcium and the like. These metals may exist as their oxides. These metals are each preferably contained in an amount of 0.001% by weight or less of the metal components contained in the LDS additive.

A second embodiment of the LDS additive used in the present invention is an embodiment comprising at least one member selected from mica, silicon dioxide and titanium oxide in addition to an oxide containing antimony and tin. Preferred examples in the second embodiment include an LDS additive comprising 40 to 45% by weight of an oxide containing antimony and tin and 50 to 60% by weight in total of mica and silicon dioxide, or an LDS additive comprising 35 to 53% by weight of an oxide containing antimony and tin, 35 to 53% by weight in total of mica and silicon dioxide, and 11 to 15% by weight of titanium dioxide.

The LDS additive used in a third embodiment of the present invention preferably comprises a conductive oxide containing at least two metals and having a resistivity of $5 \times 10^3$ $\Omega \cdot cm$ or less. The resistivity of the conductive oxide is preferably $8 \times 10^2$ $\Omega \cdot cm$ or less, more preferably $7 \times 10^2$ $\Omega \cdot cm$ or less, even more preferably $5 \times 10^2$ $\Omega \cdot cm$ or less. The lower limit is not specifically defined, but can be, for example, $1 \times 10^1$ $\Omega \cdot cm$ or more, even $1 \times 10^2$ $\Omega \cdot cm$ or more.

As used herein, the resistivity of the conductive oxide typically refers to powder resistivity, which can be measured with the tester "model 3223" from Yokogawa Electric Corporation by loading 10 g of fine powder of the conductive oxide into a cylinder having an internal diameter of 25 mm coated with Teflon on the inside and pressurizing it at 100 $kg/cm^2$ (packing density 20%).

The LDS additive used in the third embodiment is not specifically limited so far as it comprises a conductive oxide having a resistivity of $5\times10^3$ Ω·cm or less, but preferably contains at least two metals, specifically contains a metal of Group n (wherein n is an integer of 3 to 16) and a metal of Group n+1 of the periodic table. Preferably, n is an integer of 10 to 13, more preferably 12 or 13.

The LDS additive used in the third embodiment preferably contains 15 mol % or less, more preferably 12 mol % or less, especially preferably 10 mol % or less of one of a metal of Group n (wherein n is an integer of 3 to 16) and a metal of Group n+1 of the periodic table provided that the total amount of both metals in the LDS additive is 100 mol %. The lower limit is not specifically defined, but should be 0.0001 mol % or more. When two or more metals are contained in such ranges, plating properties can be improved. In the present invention, an oxide of a metal of Group n doped with a metal of Group n+1 is especially preferred.

Further, the metal of Group n and the metal of Group n+1 of the periodic table described above preferably account for 98% by weight or more of the metal components contained in the LDS additive used in the third embodiment.

Metals of Group n of the periodic table include, for example, metals of Group 3 (scandium, yttrium), Group 4 (titanium, zirconium and the like), Group 5 (vanadium, niobium and the like), Group 6 (chromium, molybdenum and the like), Group 7 (manganese and the like), Group 8 (iron, ruthenium and the like), Group 9 (cobalt, rhodium, iridium and the like), Group 10 (nickel, palladium, platinum), Group 11 (copper, silver, gold and the like), Group 12 (zinc, cadmium and the like), Group 13 (aluminum, gallium, indium and the like), Group 14 (germanium, tin and the like), Group 15 (arsenic, antimony and the like), and Group 16 (selenium, tellurium and the like), as well as oxides of these metals and the like. Among others, metals of Group 12 (n=12) or oxides thereof are preferred, more preferably zinc.

Metals of Group n+1 of the periodic table include, for example, metals of Group 4 (titanium, zirconium and the like), Group 5 (vanadium, niobium and the like), Group 6 (chromium, molybdenum and the like), Group 7 (manganese and the like), Group 8 (iron, ruthenium and the like), Group 9 (cobalt, rhodium, iridium and the like), Group 10 (nickel, palladium, platinum), Group 11 (copper, silver, gold and the like), Group 12 (zinc, cadmium and the like), Group 13 (aluminum, gallium, indium and the like), Group 14 (germanium, tin and the like), Group 15 (arsenic, antimony and the like), and Group 16 (selenium, tellurium and the like), as well as oxides of these metals and the like. Among others, metals of Group 13 (n+1=13) or oxides thereof are preferred, more preferably aluminum or gallium, even more preferably aluminum.

The LDS additive used in the third embodiment may contain metals other than the conductive metal oxide. Examples of metals other than the conductive oxide include antimony, titanium, indium, iron, cobalt, nickel, cadmium, silver, bismuth, arsenic, manganese, chromium, magnesium, calcium and the like. These metals may exist as their oxides. These metals are each preferably contained in an amount of 0.01% by weight or less of the LDS additive.

It should be noted that the LDS additive used in the third embodiment preferably contains antimony in an amount of 3% by weight or less, more preferably 1% by weight or less, even more preferably 0.01% by weight or less, especially preferably substantially zero based on the LDS additive to improve the L value. As used herein, substantially zero means that the component of interest is not contained at any levels that would influence the advantages of the present invention.

The LDS additive used in the third embodiment is preferably capable of absorbing light having a wavelength of 1064 nm. When it is capable of absorbing light having a wavelength of 1064 nm, a plated layer can be readily formed on the surface of resin molded articles.

The LDS additive used in the third embodiment preferably has an average particle size of 0.01 to 50 μm, more preferably 0.05 to 30 μm. When it has such a feature, the homogeneity of the state of plated surfaces tends to be more improved.

The LDS additive preferably has a particle size of 0.01 to 100 μm, more preferably 0.05 to 10 μm. When it has such a feature, the homogeneity of the state of plated surfaces tends to be more improved.

The amount of the LDS additive contained in the thermoplastic resin compositions of the present invention is typically 1 to 30 parts by weight, preferably 2 to 25 parts by weight, more preferably 5 to 20 parts by weight per 100 parts by weight of the thermoplastic resin. When the LDS additive is contained in an amount within such ranges, the plating properties of resin molded articles can be more improved. Further, plating can be achieved with smaller amounts by combining it with talc, as described later. When two or more LDS additives are contained, the total amount should preferably be in the ranges defined above.

<Glass Fiber>

The thermoplastic resin composition of the present invention further comprises a glass fiber. The incorporation of a glass fiber can improve the mechanical strength of resin molded articles. In addition, the incorporation of a glass fiber can also further improve dimensional precision. A single type of glass fiber may be used or two or more types of glass fiber may be used in combination.

The glass fiber used in the present invention has a composition comprising $SiO_2$ and $Al_2O_3$ in a proportion of 60 to 70% by weight of $SiO_2$ and 20 to 30% by weight of $Al_2O_3$. Moreover, the glass fiber used in the present invention may further comprise B (boron) along with $SiO_2$ and $Al_2O_3$, in which case the B (boron) content is preferably 1% by weight or less. Further, the glass fiber used in the present invention preferably has a tensile modulus of elasticity of 80 GPa or more. Specifically, an example of the glass fiber used in the present invention is S-glass (high strength glass). The use of a glass fiber having such a composition can improve the mechanical strength (for example, flexural stress, flexural modulus of elasticity, charpy impact strength (notched and unnotched) and the like) of the resulting resin molded articles.

Conventionally, E-glass (electrical glass) has been used in thermoplastic resin compositions, but our studies revealed that the mechanical strength of resin molded articles obtained by using E-glass was difficult to maintain at a high level with formulations containing a titanium oxide. In contrast, mechanical strength can be improved in resin molded articles obtained by using a glass fiber according to the present invention comprising $SiO_2$ and $Al_2O_3$ in a proportion of 60 to 70% by weight of $SiO_2$ and 20 to 30% by weight of $Al_2O_3$ even if a titanium oxide is added.

Thus, an example of a preferred embodiment of the present invention includes an embodiment wherein the glass fiber substantially consists of the glass fiber comprising $SiO_2$ and $Al_2O_3$ in a proportion of 60 to 70% by weight of $SiO_2$ and 20 to 30% by weight of $Al_2O_3$.

The glass fiber used in the present invention may have been surface-treated with a silane coupling agent such as γ-methacryloxypropyltrimethoxysilane, γ-glycidoxypropyltrimethoxysilane, γ-aminopropyltriethoxysilane or the like. The amount of the silane coupling agent deposited is typically 0.01 to 1% by weight based on the weight of the glass fiber. Further, the glass fiber may be used after the glass fiber has been surface-treated as appropriate with a lubricant such as a fatty acid amide compound, a silicone oil or the like; an antistatic agent such as a quaternary ammonium salt or the like; a resin having a film-coating ability such as an epoxy resin, a urethane resin or the like; or a mixture of a resin having a film-coating ability with a heat stabilizer or a flame retardant or the like.

The glass fiber used in the present invention preferably has an average diameter of 20 μm or less, more preferably 1 to 15 μm to further improve the balance among physical properties (strength, rigidity, rigidity after heating, impact strength) and to further reduce molding warpage. Further, glass fibers that are generally used often typically have a circular section, but the present invention is not specifically limited to such a sectional shape, and glass fibers having a cocoon-shaped, elliptical or rectangular section, for example, can also be used.

The glass fiber is not specifically limited to any length, and can be used by selecting it from long fiber bundles (rovings), short fiber bundles (chopped strands) and the like. Such glass fiber bundles are each preferably composed of 100 to 5000 fibers. Further, the glass fiber may be a milled strand known as so-called milled fiber or glass powder or a single continuous strand called sliver so far as the glass fiber has an average length of 0.1 mm or more in the thermoplastic resin composition after the thermoplastic resin composition has been kneaded.

The amount of the glass fiber contained in the thermoplastic resin composition of the present invention is typically 10 to 230 parts by weight, preferably 20 to 195 parts by weight, more preferably 30 to 160 parts by weight per 100 parts by weight of the thermoplastic resin. In the present invention, other glass fibers (for example, E-glass and the like) may be contained in addition to the glass fiber comprising $SiO_2$ and $Al_2O_3$ in a proportion of 60 to 70% by weight of $SiO_2$ and 20 to 30% by weight of $Al_2O_3$. In addition, other inorganic fibers may also be contained. Further, the thermoplastic resin and the inorganic fibers (preferably a glass fiber, more preferably a glass fiber comprising $SiO_2$ and $Al_2O_3$ in a proportion of 60 to 70% by weight of $SiO_2$ and 20 to 30% by weight of $Al_2O_3$) preferably account for 70% by weight or more of all components, more preferably 80% by weight or more of all components in the thermoplastic resin compositions of the present invention.

<Titanium Oxide>

The thermoplastic resin composition of the present invention further comprises a titanium oxide. When a titanium oxide is contained in the thermoplastic resin composition, the resulting resin molded articles can have high whiteness and high surface reflectance.

The amount of the titanium oxide contained in the thermoplastic resin composition of the present invention is typically 0.01 to 20 parts by weight, preferably 0.1 to 15 parts by weight, more preferably 1 to 10 parts by weight per 100 parts by weight of the thermoplastic resin. When the titanium oxide is contained in an amount within such ranges, the whiteness of the resulting resin molded articles can be more improved and a decrease in reflectance after heat treatment can be further reduced.

Among titanium oxide products widely available on the market, those containing 80% by weight or more of a titanium oxide are preferably used because of whiteness and opacity. The titanium oxide used in the present invention may be, for example, titanium monoxide (TiO), dititanium trioxide ($Ti_2O_3$), titanium dioxide ($TiO_2$) or the like, and any of them may be used, among which titanium dioxide is preferred. Further, the titanium oxide preferably used has a rutile crystal structure.

The titanium oxide preferably has an average primary particle size of 1 μm or less, more preferably in the range of 0.001 to 0.5 μm, even more preferably in the range of 0.002 to 0.1 μm. When the titanium oxide has an average particle size in such ranges and is contained in an amount in the ranges defined above, thermoplastic resin compositions providing molded articles having high whiteness and high surface reflectance can be obtained.

The titanium oxide may be used after it has been surface-treated. Surface treating agents preferably include inorganic materials and/or organic materials. Specifically, they include metal oxides such as silica, alumina, zinc oxide and the like; and organic materials such as silane coupling agents, titanium coupling agents, organic acids, polyols, silicones and the like. Further, commercially available titanium oxides may be used. In addition, titanium oxide lumps or particles having a large average size may be used after they have been ground by a suitable means and classified as appropriate through a sieve or the like into the average particle size defined above.

<Elastomer>

The thermoplastic resin composition of the present invention may further comprise an elastomer. The incorporation of an elastomer can improve the impact resistance of the thermoplastic resin composition.

The elastomer used in the present invention is preferably a graft copolymer obtained by graft copolymerization of a rubber component with a monomer component that can be copolymerized with the rubber component. The graft copolymer may be prepared by any processes such as mass polymerization, solution polymerization, suspension polymerization, emulsion polymerization and the like, and may be prepared by single-stage or multistage graft copolymerization.

The rubber component typically has a glass transition temperature of 0° C. or less, preferably −20° C. or less, more preferably −30° C. or less. Specific examples of rubber components include polybutadiene rubbers; polyisoprene rubbers; poly(alkyl acrylate) rubbers such as poly(butyl acrylate), poly(2-ethylhexyl acrylate), butyl acrylate/2-ethylhexyl acrylate copolymers and the like; silicone rubbers such as polyorganosiloxane rubbers; butadiene-acrylic composite rubbers; IPN (Interpenetrating Polymer Network) composite rubbers composed of a polyorganosiloxane rubber and a polyalkyl acrylate rubber; styrene-butadiene rubbers; ethylene-α-olefin rubbers such as ethylene-propylene rubbers, ethylene-butene rubbers, ethylene-octene rubbers and the like; ethylene-acrylic rubbers; fluororubbers; and the like. These may be used alone or as a mixture of two or more of them. Among them, polybutadiene rubbers, polyalkyl acrylate rubbers, polyorganosiloxane rubbers, IPN composite rubbers composed of a polyorganosiloxane rubber and a polyalkyl acrylate rubber, and styrene-butadiene rubbers are preferred to improve mechanical properties and surface appearance.

Specific examples of monomer components that can be graft-copolymerized with the rubber components include aromatic vinyl compounds; vinyl cyanate compounds;

(meth)acrylic acid ester compounds; (meth)acrylic acid compounds; epoxy-containing (meth)acrylic acid ester compounds such as glycidyl(meth)acrylate; maleimide compounds such as maleimide, N-methylmaleimide and N-phenylmaleimide; α,β-unsaturated carboxylic acid compounds such as maleic acid, phthalic acid and itaconic acid and their anhydrides (e.g., maleic anhydride and the like), etc. These monomer components may be used alone or as a combination of two or more of them. Among them, aromatic vinyl compounds, vinyl cyanate compounds, (meth)acrylic acid ester compounds, and (meth)acrylic acid compounds are preferred to improve mechanical properties and surface appearance, more preferably (meth)acrylic acid ester compounds. Specific examples of (meth)acrylic acid ester compounds include methyl(meth)acrylate, ethyl(meth)acrylate, butyl(meth)acrylate, cyclohexyl(meth)acrylate, octyl(meth)acrylate and the like.

The graft copolymer obtained by copolymerizing a rubber component is preferably a core-shell graft copolymer to improve impact resistance and surface appearance. Among others, especially preferred are core-shell graft copolymers comprising a core layer consisting of at least one rubber component selected from polybutadiene-containing rubbers, polybutyl acrylate-containing rubbers, polyorganosiloxane rubbers, and IPN composite rubbers composed of a polyorganosiloxane rubber and a polyalkyl acrylate rubber, and a shell layer formed by copolymerizing a (meth)acrylic acid ester around it. The core-shell graft copolymer preferably contains 40% by mass or more, more preferably 60% by mass or more of the rubber component. Further, it preferably contains 10% by mass or more of (meth)acrylic acid. It should be noted that the core-shell as used herein covers the concept widely encompassing compounds obtained by graft polymerization of a rubber component around a core-forming part though the core layer and the shell layer may not necessarily be definitely demarcated.

Preferred specific examples of these core-shell graft copolymers include methyl methacrylate-butadiene-styrene copolymers (MBS), methyl methacrylate-acrylonitrile-butadiene-styrene copolymers (MABS), methyl methacrylate-butadiene copolymers (MB), methyl methacrylate-acrylic rubber copolymers (MA), methyl methacrylate-acrylic rubber-styrene copolymers (MAS), methyl methacrylate-acrylic/butadiene rubber copolymers, methyl methacrylate-acrylic/butadiene rubber-styrene copolymers, methyl methacrylate-(acrylic/silicone IPN rubber) copolymers, styrene-ethylene-butadiene-styrene copolymers and the like. Such rubber polymers may be used alone or as a combination of two or more of them.

The amount of the elastomer contained in the thermoplastic resin composition of the present invention is preferably 0.1 to 40% by weight, more preferably 0.5 to 25% by weight, even more preferably 1 to 10% by weight of the total amount of the thermoplastic resin composition.

<Talc>

The thermoplastic resin composition of the present invention may further comprise a talc. The incorporation of talc can improve dimensional stability and product appearance, and also improve the plating properties of resin molded articles so that the resin molded articles can be successfully plated even if the LDS additive is added in smaller amounts. Talc may be used after the talc has been surface-treated with at least one of compounds selected from polyorganohydrogen siloxanes and organopolysiloxanes. In this case, the amount of the siloxane compounds deposited on talc is preferably 0.1 to 5% by weight talc.

The amount of talc contained in the thermoplastic resin composition of the present invention is preferably 0.01 to 10 parts by weight, more preferably 0.05 to 8 parts by weight, even more preferably 0.5 to 5 parts by weight per 100 parts by weight of the thermoplastic resin compositions. When talc has been surface-treated with a siloxane compound, the amount of talc surface-treated with the siloxane compound should preferably fall within the ranges defined above.

<Mold Release Agent>

The thermoplastic resin composition of the present invention may further comprise a mold release agent. The mold release agent is mainly used to improve productivity during molding of the resin composition. Mold release agents include, for example, aliphatic carboxylic acid amides, aliphatic carboxylic acids, esters of aliphatic carboxylic acids and alcohols, aliphatic hydrocarbon compounds having a number average molecular weight of 200 to 15000, polysiloxane silicone oils and the like. Among these mold release agents, carboxylic acid amide compounds are especially preferred.

Aliphatic carboxylic acid amides include, for example, compounds obtained by a dehydration reaction of a higher aliphatic monocarboxylic acid and/or polybasic acid with a diamine.

Higher aliphatic monocarboxylic acids preferably include saturated aliphatic monocarboxylic acids and hydroxycarboxylic acids containing 16 or more carbon atoms such as palmitic acid, stearic acid, behenic acid, montanic acid, 12-hydroxystearic acid and the like.

Polybasic acids include, for example, aliphatic dicarboxylic acids such as malonic acid, succinic acid, adipic acid, sebacic acid, pimelic acid and azelaic acid; aromatic dicarboxylic acids such as phthalic acid and terephthalic acid; alicyclic dicarboxylic acids such as cyclohexanedicarboxylic acid, cyclohexylsuccinic acid and the like.

Diamines include, for example, ethylenediamine, 1,3-diaminopropane, 1,4-diaminobutane, hexamethylenediamine, m-xylylenediamine, tolylenediamine, p-xylylenediamine, phenylenediamine, isophoronediamine and the like.

Carboxylic acid amide compounds preferably include compounds obtained by polycondensing stearic acid, sebacic acid and ethylenediamine, more preferably compounds obtained by polycondensing 2 moles of stearic acid, 1 mole of sebacic acid and 2 moles of ethylenediamine. Further, bisamide compounds obtained by reacting a diamine with an aliphatic carboxylic acid such as N,N'-methylenebisstearic acid amide or N,N'-ethylenebisstearic acid amide as well as dicarboxylic acid amide compounds such as N,N'-dioctadecylterephthalic acid amide can also be preferably used.

Aliphatic carboxylic acids include, for example, saturated or unsaturated aliphatic mono-, di- or tricarboxylic acids. The aliphatic carboxylic acids here also include alicyclic carboxylic acids. Among them, preferred aliphatic carboxylic acids are mono- or dicarboxylic acids containing 6 to 36 carbon atoms, more preferably saturated aliphatic monocarboxylic acids containing 6 to 36 carbon atoms. Specific example of such aliphatic carboxylic acids include palmitic acid, stearic acid, caproic acid, capric acid, lauric acid, arachic acid, behenic acid, lignoceric acid, cerotic acid, melissic acid, tetratriacontanoic acid, montanic acid, adipic acid, azelaic acid, etc.

Aliphatic carboxylic acids that can be used in esters of aliphatic carboxylic acids and alcohols include, for example, the aliphatic carboxylic acids listed above. Alcohols include, for example, saturated or unsaturated mono- or polyalcohols. These alcohols may be substituted by a substituent such as a fluorine atom or an aryl group. Among them, saturated mono- or polyalcohols containing 30 or less carbon atoms are preferred, more preferably saturated aliphatic or alicyclic monoalcohols or saturated aliphatic polyalcohols containing 30 or less carbon atoms.

Specific examples of such alcohols include octanol, decanol, dodecanol, stearyl alcohol, behenyl alcohol, ethylene glycol, diethylene glycol, glycerol, pentaerythritol, 2,2-dihydroxyperfluoropropanol, neopentylene glycol, ditrimethylolpropane, dipentaerythritol and the like.

Specific examples of esters of aliphatic carboxylic acids and alcohols include beeswax (a mixture containing myricyl palmitate as a major component), stearyl stearate, behenyl behenate, stearyl behenate, glyceryl monopalmitate, glyceryl monostearate, glyceryl distearate, glyceryl tristearate, pentaerythritol monopalmitate, pentaerythritol monostearate, pentaerythritol distearate, pentaerythritol tristearate, pentaerythritol tetrastearate and the like.

Aliphatic hydrocarbons having a number average molecular weight of 200 to 15,000 include, for example, liquid paraffin, paraffin waxes, microcrystalline waxes, polyethylene waxes, Fischer-Tropsch waxes, α-olefin oligomers containing 3 to 12 carbon atoms and the like. It should be noted that the aliphatic hydrocarbons here also include alicyclic hydrocarbons. Preferably, the aliphatic hydrocarbons have a number average molecular weight of 5,000 or less.

The amount of the mold release agent contained is typically 0.001 parts by weight or more, preferably 0.01 parts by weight or more, and typically 2 parts by weight or less, preferably 1.5 parts by weight or less per 100 parts by weight of the total of the thermoplastic resin and the glass fiber. When the mold release agent is contained at 0.001 parts by weight or more per 100 parts by weight of the total of the thermoplastic resin and the glass fiber, releasability can be improved. When the mold release agent is contained at 2 parts by weight or less per 100 parts by weight of the total of the thermoplastic resin and the glass fiber, a decrease in hydrolysis resistance can be prevented and mold contamination during injection molding can also be prevented.

<Other Additives>

The thermoplastic resin composition of the present invention may further comprise various additives so far as the advantages of the present invention are not affected. Such additives include alkalis, heat stabilizers, flame retardants, light stabilizers, antioxidants, UV absorbers, dyes/pigments, fluorescent brightening agents, anti-dripping agents, anti-static agents, anti-fogging agents, lubricants, anti-blocking agents, flow improvers, plasticizers, dispersants, antibacterial agents and the like. These components may be used alone or as a combination of two or more of them.

<Method for Manufacturing the Thermoplastic Resin Composition>

Any methods can be employed for the method for manufacturing the thermoplastic resin composition of the present invention. For example, a method comprises mixing a thermoplastic resin, an LDS additive and a glass fiber by using a mixing means such as a V-blender to prepare a batch blending, and then melting/kneading the batch in a vented extruder to pelletize the batch. An alternative method is a two-step kneading process comprising thoroughly mixing the components and the like except for the glass fiber in advance, then melting/kneading the mixture in a vented extruder to prepare pellets, then mixing the pellets with the glass fiber, and finally melting/kneading the mixture in the vented extruder.

Still another process comprises thoroughly mixing the components and the like except for the glass fiber in a V-blender or the like to prepare a mixture in advance and feeding this mixture from a first shoot of a vented twin-screw extruder while feeding the glass fiber from a second shoot in the midway of the extruder and melting/kneading the mixture of all components to pelletize the mixture.

The screw layout in the kneading zone of the extruder preferably comprises an upstream element for promoting kneading and a downstream element capable of increasing pressure.

Elements for promoting kneading include forward kneading disc elements, neutral kneading disc elements, wide kneading disc elements, and forward mixing screw elements and the like.

The heating temperature during melting/kneading can be typically selected from the range of 180 to 360° C. as appropriate. If the temperature is too high, decomposition gases may be readily released to cause opacification. Thus, the screw layout should desirably be chosen by taking into account shear heating and the like. Further, antioxidants or heat stabilizers is desirable to be used to inhibit decomposition during kneading and a subsequent molding process.

The method for manufacturing a resin molded article is not specifically limited, and any molding techniques commonly adopted for thermoplastic resin composition can be employed. Examples of such techniques include injection molding, ultra-high speed injection molding, injection compression molding, two-color molding, gas-assisted or other hollow molding, molding techniques using thermally insulated molds, molding techniques using rapidly heated molds, expansion molding (including the use of supercritical fluids), insert molding, IMC (In-Mold Coating) molding techniques, extrusion molding, sheet molding, heat molding, rotational molding, laminate molding, press molding, blow molding and the like. Further, molding techniques using hot runner systems can also be used.

<Method for Manufacturing the Resin Molded Article Having a Plated Layer>

Next, the method for manufacturing the resin molded article having a plated layer of the present invention will be explained, specifically a method for plating a surface of a resin molded article obtained by molding the thermoplastic resin composition of the present invention will be explained with reference to FIG. 1.

FIG. 1 is a schematic diagram showing a process for plating the surface of a resin molded article 1 by the laser direct structuring technology. In FIG. 1, the resin molded article 1 is shown as a flat substrate, but may not be necessarily a flat substrate and instead a resin molded article having a partially or totally curved surface. Further, the resin molded article 1 may not be an end product, but includes various parts.

The resin molded article 1 in the present invention is preferably a part for portable electronic devices. The part for portable electronic devices has not only high impact resistance and rigidity but also excellent heat resistance as well as low anisotropy and low warpage so that the resin molded article is very effective as an internal structure and a chassis for electronic organizers, PDAs such as hand-held computers and electronic databook; pagers, cell phones, PHS phones and the like. In particular, the resin molded article is suitable for use as a flat part for portable electronic devices when the molded article has an average thickness of 1.2 mm or less excluding ribs (and, for example, 0.4 mm or more though the lower limit is not specifically defined), and it is especially suitable for use as a chassis.

Referring again to FIG. 1, the resin molded article 1 is irradiated with a laser beam 2 in the process for preparing a resin molded article having a plated layer of the present invention.

The source of the laser beam 2 is not specifically limited, and can be appropriately selected from known lasers such as YAG lasers, excimer lasers, electromagnetic radiation and the like, especially preferably YAG lasers. Further, the wavelength of the laser beam 2 is not specifically limited, either. A preferred wavelength range of the laser beam 2 is 200 on to 1200 nm, especially preferably 800 to 1200 nm.

Once the resin molded article 1 is irradiated with the laser beam 2, the resin molded article 1 is activated only in the region 3 irradiated with the laser beam 2. A plating solution 4 is applied to the resin molded article 1 in the activated state. The plating solution 4 is not specifically limited, and known plating solutions can be widely employed, preferably plating solutions containing a metal component such as copper, nickel, gold, silver or palladium, more preferably copper.

The method by which the plating solution 4 is applied to the resin molded article 1 is not specifically limited either, but involves, for example, placing the article into a liquid containing the plating solution. After the plating solution has been applied to the resin molded article 1, a plated layer 5 is formed only on the region irradiated with the laser beam 2.

According to the processes of the present invention, circuits can be formed at distances of 1 mm or less, even 150 μm or less from each other (and, for example, 30 μm or more though the lower limit is not specifically defined). Such circuits are preferably used as antennas for portable electronic devices. Thus, an example of a preferred embodiment of the resin molded article 1 of the present invention is a resin molded article Having a plated layer for use as a part for portable electronic devices wherein the plated layer has performance as an antenna.

Additionally, references can be made to the descriptions in JP-A2011-219620, JP-A2011-195820, JP-A2011-178873, JP-A2011-168705, and JP-A2011-148267 without departing from the spirit of the present invention.

EXAMPLES

The present invention will further be detailed below referring to Examples. Materials, amount of use, ratio, details of processes, procedures of process and so forth described in Examples below may be modified arbitrarily, without departing from the spirit of the present invention. Accordingly, the scope of the present invention should not be construed to be limited by Examples below.

<Thermoplastic Resin>
PAMP10: A polyamide resin (from MITSUBISHI GAS CHEMICAL COMPANY, INC.).

<LDS Additives>
Iriotec 8820: An antimony-doped tin oxide having an L value of 64.4 (containing 36 to 50% by weight of $(Sn_xSb_{1-x})O_2$, 35 to 53% by weight of mica+silicon dioxide, and 11 to 15% by weight of titanium dioxide) (from Merck).
Minatec 40CM: An antimony-doped tin oxide having an L value of 62.9 (containing 43% by weight of $(Sn_xSb_{1-x})O_2$, and 57% by weight of mica+silicon dioxide) (from Merck).
CP5C: An antimony-doped tin oxide having an L value of 65.9 (containing 95% by weight of a tin oxide, 5% by weight of an antimony oxide, 0.02% by weight of a lead oxide, and 0.004% by weight of a copper oxide) (from Keeling & Walker).
Black 1G: A copper-chromium oxide ($CuCr_2O_4$) having an L value of 15.6 (from Shepherd Color Japan, Inc.).

<Glass Fibers>
03T-296GH: E-glass (from Nippon Electric Glass Co., Ltd.).
S-glass (having a tensile modulus of elasticity of 86 GPa and containing 65% by weight of $SiO_2$, 25% by weight of $Al_2O_3$, and 0.001 to 0.01% by weight of B (boron)).

<White Pigments>
Titanium dioxide: CR-63 (from ISHIHARA SANGYO KAISHA, LTD.). Zinc sulfide: TIPAQUE R-630 (from ISHIHARA SANGYO KAISHA, LTD.)

<Elastomer>
SEBS: FT1901GT (from Kraton Performance Polymers, Inc.).

<Talc>
Talc: Micron White 5000S (from Hayashi-Kasei Co., Ltd.).

<Mold Release Agent>
CS8CP (from NITTO KASEI KOGYO K.K.).

<Compounds>
Various components were weighed in the compositions shown in the table below, and all components excluding the glass fibers were blended in a tumbler and introduced into a twin-screw extruder (TEM26SS from TOSHIBA MACHINE CO., LTD.) from the rear ends of the screws and melted, and then each glass fiber was supplied from a side feeder to prepare resin pellets. The extruder was operated at a temperature setting of 280° C.

<Preparation of ISO Tensile Test Specimens>
The pellets obtained by the preparation process described above were dried at 80° C. for 5 hours, and then injection-molded using an injection molding machine (100T) from FANUC Corporation to form ISO tensile test specimens (having a thickness of 4 mm) under conditions of a cylinder temperature of 280° C. and a mold temperature of 130° C.

Injection velocity: Injection velocity was set in such a manner that the flow rate of the resin calculated from the sectional area of the center zone of each ISO tensile test specimen equaled 300 mm/s. The velocity/pressure switch-over point to the holding phase was adjusted at approximately 95% of filling. The holding phase lasted 25 seconds at 500 kgf/cm$^2$, i.e., a relatively high pressure without flashing.

<Flexural Strength and Flexural Modulus of Elasticity>
The ISO tensile test specimens (having a thickness of 4 mm) described above were used to determine their flexural strength (expressed in MPa) and flexural modulus of elasticity (expressed in GPa) at a temperature of 23° C. according to ISO178.

<Charpy Impact Strength>
The ISO tensile test specimens (having a thickness of 4 mm) obtained by the method described above were used to determine their charpy notched impact strength and charpy unnotched impact strength under conditions of 23° C. according to ISO179-1 or ISO179-2. The results are shown in Table 1 below.

<Plating Appearance>
Each resin composition was molded by filling each of the resin composition into the cavity of a mold of 60×60 mm having a thickness of 2 mm from a fan gate having a width of 60 mm and a thickness of 1.5 mm at a resin temperature of 280° C. and a mold temperature of 110° C. The gate portion was cut off to give a plating test specimen.

An area of 10×10 mm of the plating test specimen obtained was irradiated using the laser irradiation system VMc1 from Trumpf (a YAG laser with a wavelength of 1064 nm and a maximum output power of 15 W) at an output power of 60%, a frequency of 100 kHz, and a scanning speed of 4 m/s. This was followed by a plating process in the electroless plating bath ENPLATE LDS CU-400 PC from Enthone at 48° C. Plating performance was visually determined from the thickness of the layer of copper deposited in 20 minutes.

Evaluation was based on the following criteria. The results are shown in Table 1.

○: Good appearance (a thick plated layer has been formed as proved by a deep copper color).

Δ: A plated layer has been formed, though the plated layer is somewhat thin (acceptable for practical uses).

x: No plated layer has been formed.

<L Value>

The L value (lightness) of the specimen of 60×60 mm having a thickness of 2 mm was measured using a colorimeter (Spectro Color Meter SE2000 from NIPPON DENSHOKU INDUSTRIES CO., LTD.). Evaluation was based on the following criteria. The results are shown in Table 1.

○: L value of 60 or more (good whiteness).

x: L value of less than 60 (poor whiteness).

composition obtained in Comparative example 3 was not good in plating properties because it contained a zinc sulfide instead of a titanium oxide.

As has been described above, it was shown that the present invention makes it possible to provide thermoplastic resin molded articles having excellent whiteness and mechanical strength while retaining the plating properties of the resin molded articles.

SYMBOL LEGEND

1: Resin molded article; 2: Laser beam; 3: Laser-irradiated region; 4: Plating solution; 5: Plated layer.

What is claimed is:

1. A thermoplastic resin composition comprising a thermoplastic resin, and 1 to 30 parts by weight of a laser direct structuring additive, 0.1 to 20 parts by weight of a titanium oxide and 10 to 230 parts by weight of a glass fiber per 100 parts by weight of the thermoplastic resin, wherein the laser direct structuring additive has an L value of 50 or more, and

TABLE 1

|  |  |  | Example 1 | Example 2 | Example 3 | Comparative example 3 | Comparative example 4 | Comparative example 5 |
|---|---|---|---|---|---|---|---|---|
| Thermoplastic resin |  | PAMP10 | 100 | 100 | 100 | 100 | 100 | 100 |
| LDS additive | An oxide containing Sb and Sn | Iriotec8820 | 12.8 |  |  |  | 12.8 | 12.1 |
|  |  | Minatec 40CM |  |  | 12.8 |  |  |  |
|  |  | CP5C |  | 12.8 |  |  |  |  |
|  | $CuCr_2O_4$ | Black1G |  |  |  | 12.8 |  |  |
| Glass fiber |  | S-glass | 85.7 | 85.7 | 85.7 | 85.7 |  | 80.5 |
|  |  | 03T-296GH(E-glass) |  |  |  |  | 85.7 |  |
| White pigment | $TiO_2$ | CR-63 | 6.4 | 6.4 | 6.4 | 6.4 | 6.4 |  |
|  | ZnS | TIPAQUE R-630 |  |  |  |  |  | 6 |
| Elastomer |  | FT1901GT | 6.4 | 6.4 | 6.4 | 6.4 | 6.4 | 6 |
| Talc |  | MW5000S | 2.1 | 2.1 | 2.1 | 2.1 | 2.1 | 2 |
| Mold release agent |  | CS8CP | 0.6 | 0.6 | 0.6 | 0.6 | 0.6 | 0.6 |
| Flexural strength |  | MPa | 250 | 278 | 240 | 258 | 201 | 270 |
| Flexural modulus of elasticity |  | GPa | 13.7 | 16.7 | 13.8 | 13.6 | 12.3 | 13.5 |
| Charpy impact strength | notched | $kJ/m^2$ | 8.5 | 7.5 | 7.1 | 7.7 | 3.4 | 9.5 |
|  | unnotched | $kJ/m^2$ | 55 | 52 | 47 | 53 | 34 | 61 |
| Color difference | L value |  | ○ | ○ | ○ | X | ○ | ○ |
| Plating appearance |  |  | ○ | ○ | ○ | ○ | ○ | X |

The results of Table 1 show that the thermoplastic resin compositions obtained in Examples 1 to 3 were excellent in all of flexural strength, flexural modulus of elasticity, charpy impact strength, L value and plating properties (plating appearance) of the resulting resin molded articles.

However, the thermoplastic resin composition obtained in Comparative example 1 did not have a good L value, because it did not use an LDS additive having L value of 50 or more. Specifically, the thermoplastic resin composition obtained in Comparative example 1 was not white in color because it comprises a copper-chromium oxide instead of an oxide containing antimony and tin as an LDS additive.

On the other hand, the thermoplastic resin composition obtained in Comparative example 2 was not good in flexural strength and charpy impact strength because it did not use a glass fiber containing 60 to 70% by weight of $SiO_2$ and 20 to 30% by weight of $Al_2O_3$.

Further, a plated layer could not be successfully formed on the resin molded article made from the thermoplastic resin composition obtained in Comparative example 3 because it did not contain a titanium oxide. Specifically, the resin molded article made from the thermoplastic resin the glass fiber comprises $SiO_2$ and $Al_2O_3$ in a proportion of 60 to 70% by weight of $SiO_2$ and 20 to 30% by weight of $Al_2O_3$.

2. The thermoplastic resin composition according to claim 1, wherein the laser direct structuring additive is an oxide containing antimony and tin.

3. The thermoplastic resin composition according to claim 2, wherein the laser direct structuring additive contains tin in excess of antimony.

4. The thermoplastic resin composition according to claim 3, wherein the glass fiber has a tensile modulus of elasticity of 80 GPa or more.

5. The thermoplastic resin composition according to claim 3, wherein the glass fiber comprises S-glass.

6. The thermoplastic resin composition according to claim 3, wherein the thermoplastic resin is a polyamide resin.

7. The thermoplastic resin composition according to claim 2, wherein the glass fiber has a tensile modulus of elasticity of 80 GPa or more.

8. The thermoplastic resin composition according to claim 2, wherein the glass fiber comprises S-glass.

9. The thermoplastic resin composition according to claim 2, wherein the thermoplastic resin is a polyamide resin.

10. The thermoplastic resin composition according to claim 1, wherein the glass fiber has a tensile modulus of elasticity of 80 GPa or more.

11. The thermoplastic resin composition according to claim 1, wherein the glass fiber comprises S-glass.

12. The thermoplastic resin composition according to claim 1, wherein the thermoplastic resin is a polyamide resin.

13. A resin molded article obtained by molding a thermoplastic resin composition according to claim 1.

14. The resin molded article according to claim 13, which has an L value of 60 or more.

15. The resin molded article according to claim 13, further comprising a plated layer on a surface thereof.

16. The resin molded article according to claim 15, wherein the plated layer has performance as an antenna.

17. The resin molded article according to claim 13, which is a part for portable electronic devices.

18. A method for manufacturing a resin molded article having a plated layer, comprising irradiating a surface of a resin molded article obtained by molding a thermoplastic resin composition according to claim 1 with a laser beam, and then applying a metal to form a plated layer.

19. The method for manufacturing a resin molded article having a plated layer according to claim 18, wherein the plated layer is a copper plated layer.

20. A method for manufacturing a part for portable electronic devices, comprising the method for manufacturing a resin molded article having a plated layer according to claim 18.

* * * * *